United States Patent
Choi

(10) Patent No.: US 7,286,331 B2
(45) Date of Patent: Oct. 23, 2007

(54) ELECTROSTATIC PROTECTION DEVICE FOR SEMICONDUCTOR DEVICE

(75) Inventor: Nak Heon Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 5 days.

(21) Appl. No.: 11/317,764

(22) Filed: Dec. 23, 2005

(65) Prior Publication Data

US 2006/0139826 A1 Jun. 29, 2006

(30) Foreign Application Priority Data

Dec. 28, 2004 (KR) ............... 10-2004-0114210

(51) Int. Cl.
*H02H 9/00* (2006.01)
(52) U.S. Cl. .................. 361/56; 361/111
(58) Field of Classification Search .......... 361/56
See application file for complete search history.

(56) References Cited

U.S. PATENT DOCUMENTS 5,946,177 A 8/1999 Miller et al. ............. 361/56
6,078,487 A * 6/2000 Partovi et al. ............ 361/56
6,690,561 B2 * 2/2004 Hung et al. ............. 361/111
2005/0231866 A1 * 10/2005 Mergens et al. ......... 361/56
2006/0087788 A1 * 4/2006 Gibet et al. ............. 361/100

* cited by examiner

*Primary Examiner*—Stephen W. Jackson
*Assistant Examiner*—Luis E. Román
(74) *Attorney, Agent, or Firm*—Ladas & Parry LLP

(57) ABSTRACT

Disclosed is an electrostatic protection device for a semiconductor device, which protects the semiconductor device from damage due to electrostatic discharge (ESD). The electrostatic protection device includes a delivery unit for inducing the static electricity introduced to the input/output port to an external voltage line, a detection unit for detecting the static electricity induced to the external voltage line and outputting a detected voltage in response to the static electricity induced to the external voltage line, and a driver driven by the detected voltage in order to drive the electrostatic discharge unit in response to the static electricity induced to the external voltage line.

8 Claims, 2 Drawing Sheets

US 7,286,331 B2

ELECTROSTATIC PROTECTION DEVICE FOR SEMICONDUCTOR DEVICE

BACKGROUND OF THE INVENTION

1. Field of the Invention

The present invention relates to an electrostatic protection device for a semiconductor device, and more particularly to an electrostatic protection device for a semiconductor device, which protects a semiconductor integrated circuit from damage due to electrostatic discharge (ESD).

2. Description of the Prior Art

As generally known in the art, electrostatic discharge (ESD) is one of main factors affecting the reliability of a semiconductor chip. This electrostatic discharge causes damage to a semiconductor chip when the semiconductor chip is handled, or installed in a system. Accordingly, an electrostatic protection device is indispensably provided to a data input/output area of a semiconductor device in order to protect the semiconductor device from static electricity. If an electrically charged human body or machine makes contact with a semiconductor device, static electricity charged in the human body or the machine is discharged inside of the semiconductor device through an input/output port of an external pin in the semiconductor device, so that excessive electrostatic current having high energy may inflict fatal damage on an internal circuit of the semiconductor device. Most semiconductor devices include an electrostatic protection device between an input/output port and an internal circuit of the semiconductor device in order to prevent an internal main circuit from being damaged by the static electricity.

In the meantime, as a technique of manufacturing a semiconductor device becomes developed, the thickness of a gate insulating layer of a transistor included in an input/output buffer is further reduced, so that the internal circuit of the semiconductor device may be more easily damaged due to static electricity. In other words, if the thickness of the gate insulating layer of the transistor is reduced, destructive voltage for the gate insulating layer is lowered. Thus, if a conventional electrostatic protection device is used, the gate insulating layer of the transistor may be destructed even if relatively lower static electricity is applied thereto. In order to solve the problem, a method for employing a transistor for the electrostatic protection device has been suggested.

FIG. 1 is a circuit diagram illustrating the conventional electrostatic protection device of a semiconductor device.

The conventional electrostatic protection device includes a delivery module 11, a control module 12, a driver 13, and a discharge module 14. The delivery module 11 induces static electricity to a line 17 of external voltage (Vcc) instead of an internal circuit in the semiconductor device through an input/output port 15. Such static electricity induced to the line 17 of the external voltage is delivered to the control module 12, the driver 13, and the discharge module 14 connected to the line 17. The control module 12 includes a resistor R1 and a capacitor C1 serially connected between the line 17 of the external voltage (Vcc) and a line 18 of the grounding voltage (Vss). The driver 13 has a CMOS type buffer including a PMOS transistor P1 and an NMOS transistor N1 serially connected between the line 17 of the external voltage (Vcc) and the line 18 of the grounding voltage (Vss). The discharge module 14 includes an NMOS transistor N2 connected between the line 17 of the external voltage VCC and the line 18 of the grounding voltage Vss.

In the electrostatic protection device for the semiconductor device, the static electricity induced to the line 17 of the external voltage (Vcc) through the delivery module 11 generates a voltage drop by means of the control module 12, and the PMOS transistor P1 of the driver 13 is turned on due to the voltage drop. As a result, the NMOS transistor N2 of the discharge module 14 is turned on, so that the line 17 of the external voltage Vcc is connected to the line 18 of the grounding voltage Vss. Accordingly, static electricity induced to the line 17 of the external voltage Vcc is discharged through the line 18 of the grounding voltage Vss. In other words, static electricity introduced into the input/output port 15 is induced to the line 17 of the external voltage Vcc and then discharged through the line 18 of the grounding voltage Vss. Accordingly, the electrostatic protection device protects the internal circuit 16 of the semiconductor device from static electricity introduced through the input/output port 15.

As described above, the conventional electrostatic protection device for a semiconductor device operates earlier than a time point of a junction breakdown. However, the conventional electrostatic protection device has a fast operation speed because a voltage drop of the control module 12 swiftly occurs. However, since the voltage drop is generated only during a rising interval of the static electricity, the operation duration of the electrostatic protection device is short. In other words, since the voltage drop of the control module 12 occurs only during a rising interval of static electricity, the driver 13 operates only during the rising interval so as to discharge static electricity. As a result, since the internal circuit of the semiconductor device is not protected from static electricity during intervals except for the rising interval of the static electricity (e.g., a peak interval of a static electricity and a falling interval of a static electricity), the internal circuit may be damaged during the intervals.

In order to solve this problem, as shown in FIG. 2, U.S. Pat. No. 5,946,177 suggests that a electrostatic protection device for a semiconductor device additionally includes a delay module 29 in order to reduce the attenuation time of voltage applied to the discharge module 24 by the driver 23.

In other words, an electrostatic protection device for a semiconductor device shown in FIG. 2 includes a delivery module 21, a control module 22, a driver 23, a discharge module 24, and a delay module 29. Static electricity introduced through an input/output port 25 is induced to the line 27 of an external voltage Vcc through the delivery module 21, and then the control module 22 performs voltage drop for the static electricity so as to operate the driver 23. Accordingly, the discharge module 24 delivers static electricity induced to the line 27 of the external voltage Vcc to a line 28 of a grounding voltage Vss, thereby discharging the static electricity. At this time, the delay module 29 delays an attenuation time of voltage applied in order to operate the discharge module 24 through the operation of a resistor element R3 and a capacitor C3. Accordingly, the electrostatic protection device shown in FIG. 2 may further increase an operation duration time as compared with the electrostatic protection device shown in FIG. 1. However, a constant value of an RC approximating to a time, in which a static electricity signal is continuously maintained, is required in order to delay voltage attenuation due to the resistor R3 and the capacitor C3 of the delay module 29. In other words, since the driver 23 does not operate after a rising duration, voltage used for operating the discharge module 24 is attenuated according to a time as charges filled in the capacitor C3 are slowly discharged through the resistor R3. Voltage according to a time is expressed as an equation, $$v(t) = |v|e^{-\frac{t}{RC}}.$$

Herein, the t, the R, the C, and |v| denote time, resistance of a resistor, capacitance of a capacitor, and the peak value of the voltage v(t).

Accordingly, voltage required for operating the driver 23 due to voltage drop through the control module 22 is determined by a constant value of RC obtained based on the resistor R2 and the capacitor C2, and voltage required for operating the discharge module 24 by the driver 23 is determined by a constant value of RC obtained based on the resistor R3 and the capacitor C3 of the delay module. The control module 22 must have an RC value smaller than or equal to 10 ns in order to allow the electrostatic protection device to swiftly respond to static electricity and operate, and the delay module 29 must have an RC value larger than or equal to 100 ns, which is the time interval of the electrostatic discharge pulse width.

In other words, the resistor R3 and the capacitor C3 of the delay module 29 must have values larger than or equal to 10 times values of the resistor R2 and the capacitor C2 of the control module 22. As a result, the size of the semiconductor device may increase.

SUMMARY OF THE INVENTION

Accordingly, the present invention has been made to solve the above-mentioned problems occurring in the prior art, and an object of the present invention is to provide a electrostatic protection device for a semiconductor device, which can stably protect a semiconductor device from electrostatic discharge by discharging the static electricity in the duration of static electricity without increasing the size of the semiconductor device.

In order to accomplish the object, there is provided an electrostatic protection device for a semiconductor device for protecting an internal circuit of the semiconductor device by discharging static electricity introduced into an input/output port through an electrostatic discharge unit, the electrostatic protection device including a delivery unit for inducing the static electricity introduced to the input/output port to an voltage line, a detection unit for detecting the static electricity induced to the voltage line and outputting a detected voltage in response to the static electricity induced to the voltage line, and a driver driven by the detected voltage in order to drive the electrostatic discharge unit in response to the static electricity induced to the voltage line.

The driver includes a CMOS type buffer connected between an output port of the detection unit and a grounding port, and an input port of the CMOS type buffer is connected to the voltage line.

The detection unit includes a resistor and a diode serially connected to the voltage line and the input/output port.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
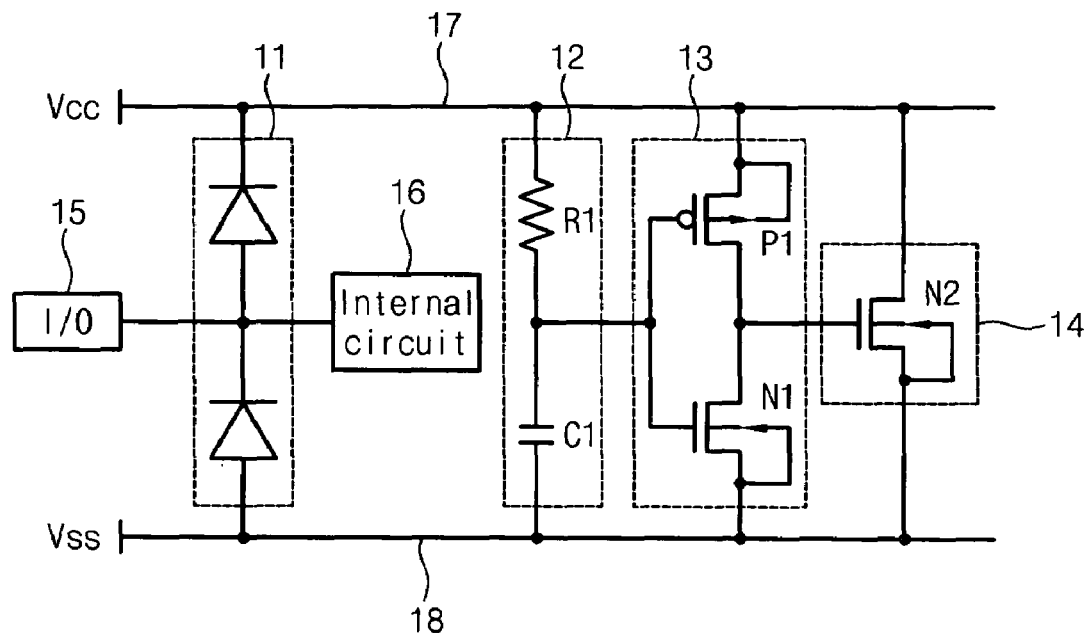
FIG. 1 is a circuit diagram for explaining an electrostatic protection device of a semiconductor device in the conventional technique.
Figure 2:
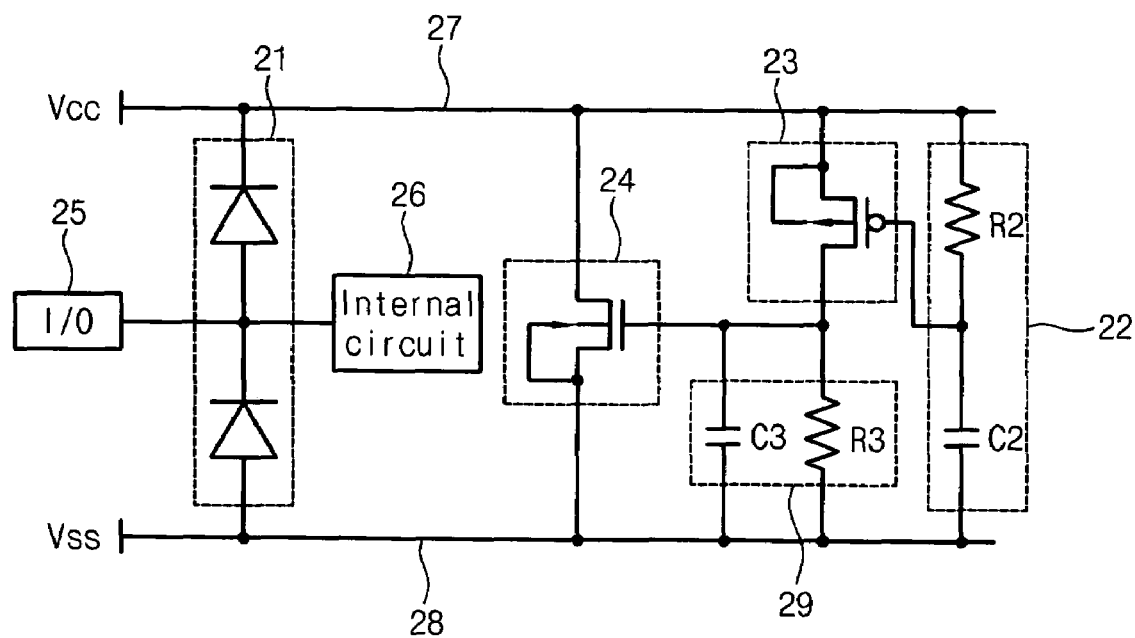
FIG. 2 is a circuit diagram for explaining another electrostatic protection device of a semiconductor device in the conventional technique.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
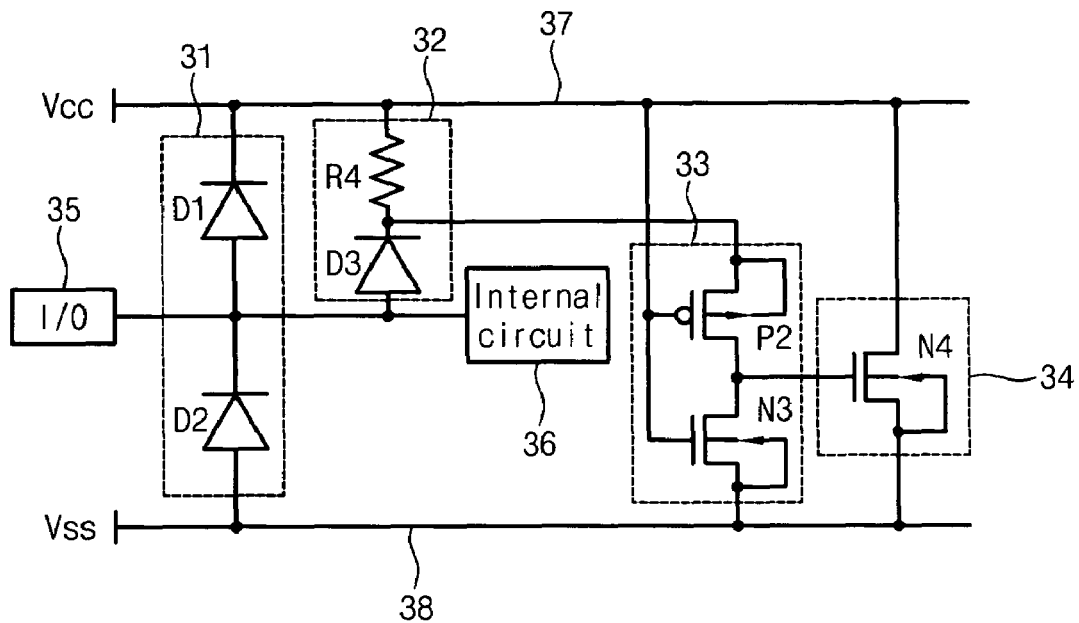
FIG. 3 is a circuit diagram for explaining a electrostatic protection device for a semiconductor device according to a preferred embodiment of the present invention.

FIG. 3 is a circuit diagram for explaining an electrostatic protection device for a semiconductor device according to the present invention.

The electrostatic protection device for a semiconductor device according to the present invention includes a delivery module 31, a detection module 32, a driver 33, and a discharge module 34. The delivery module 31 includes diodes D1 and D2 serially connected between a line 37 of an external voltage Vcc and a line 38 of a grounding voltage Vss. Cathodes of the diodes D1 and D2 are connected to the side of the line 37 of the external voltage Vcc, and anodes of the diodes D1 and D2 are connected to the side of the line 38 of the grounding voltage Vss. The delivery module 31 induces static electricity to the line 37 of the external voltage Vcc such that static electricity introduced through an input/output port 35 is not delivered to an internal circuit 36.

The detection module 32 includes a resistor R4 and a diode D3 serially connected between the line 37 of the external voltage Vcc and an input port 35 of the internal circuit 36. The detection module 32 detects static electricity induced to the line 37 of the external voltage Vcc and applies detected voltage to the driver 33 in response to the static electricity. The detected voltage is obtained by performing voltage drop through a resistor R4 with respect to the static electricity induced to the line 37 of the external voltage Vcc. In other words, the detected voltage is voltage of a common connection port of the resistor R4 and the diode D3, and the driver 33 operates based on the detected voltage.

The driver 33 includes a PMOS transistor P2 and an NMOS transistor N3 serially connected between an output port of the detection module 32 and the line 38 of the grounding voltage Vss. In other words, the driver 33 includes a CMOS type buffer unit formed by the PMOS transistor P2 and the NMOS transistor N3. The detected voltage inputted from the detection module 32 is applied to a source port of the PMOS transistor (P2), and the driver 33 is driven by the detected voltage. The detected voltage inputted from the detection module 32 becomes a supply voltage of the CMOS type buffer unit. When the CMOS type buffer operates based on the detected voltage, the static electricity induced to the line 37 of the external voltage Vcc is applied to the input ports of the CMOS type buffer, that is, gate ports of the PMOS transistor P2 and the NMOS transistor N3. Accordingly, the driver 33 operates the discharge module 34.

The discharge module 34 includes an NMOS transistor N4 connected between the line 37 of the external voltage Vcc and the line 38 of the grounding voltage Vss. A drain port of the NMOS transistor N4 is connected to the line 37 of the external voltage Vcc, and the source port of the NMOS transistor N4 is connected to the line 38 of the grounding voltage Vss. If the discharge module 34 is enabled by the driver 33, the NMOS transistor N4 is turned on. Accordingly, static electricity induced to the line 37 of the external voltage Vcc is delivered to the line 38 of the grounding voltage Vss through the NMOS transistor N4. In other words, the static electricity introduced to the input/output port 35 is induced to the line 37 of the external voltage Vcc and then discharged through the line 38 of the grounding voltage Vss. Accordingly, the electrostatic protection device protects the internal circuit 36 of the semiconductor device from static electricity introduced to the input/output port 35.

Such an electrostatic protection device for a semiconductor device according to the present invention induces static electricity introduced to the input/output port 35 to the line 37 of the external voltage Vcc through the delivery module 31. In addition, the electrostatic protection device always detects static electricity induced to the line 37 of the external voltage Vcc through the detection module 32. In addition, the detection module 32 applies a detected voltage to the driver 33 in response to the static electricity, thereby operating the driver 33. Thus, the driver 33 operates in response to static electricity, so that static electricity induced to the line 37 of the external voltage Vcc is delivered to the line 38 of the grounding voltage Vss through the discharge module 34 and discharged. In other words, when static electricity is introduced to the input/output port 35, the electrostatic protection device for the semiconductor device according to the present invention always operates in response to static electricity. In addition, the electrostatic protection device operates during all intervals of the static electricity. Accordingly, the electrostatic protection device for the semiconductor device according to the present invention operates during all intervals including a rising interval of static electricity introduced to the input/output port 35, thereby protecting the internal circuit 36 of the semiconductor device from static electricity.

Figure 4:
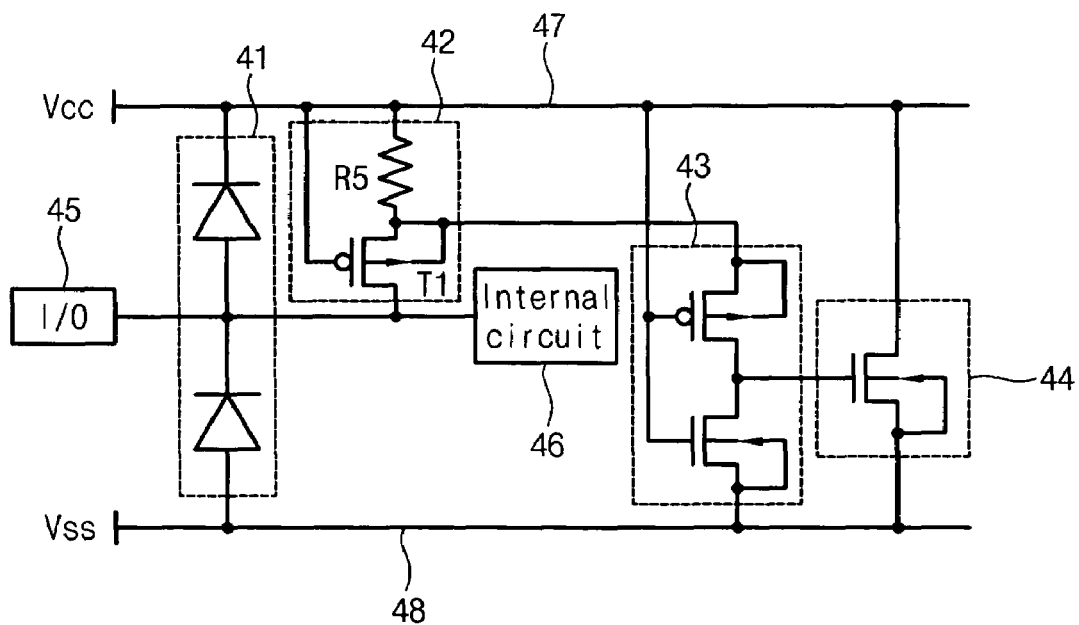
FIG. 4 is a circuit diagram for explaining a electrostatic protection device for a semiconductor device according to another embodiment of the present invention.

FIG. 4 is a circuit diagram for explaining an electrostatic protection device for a semiconductor device according to another embodiment of the present invention. Hereinafter, only components different from the components shown in FIG. 3 will be described.

The electrostatic protection device for a semiconductor device according to the present embodiment includes a detection module 42 having a resistor R5 and a diode type transistor T1 differently from the prior embodiment including the detection module 32 having the resistor R4 and the diode D3. In other words, the detection module 42 of the electrostatic protection device for the semiconductor device according to an embodiment of the present invention includes a resistor element R5 and a diode type transistor T1 connected serially between a line 47 of an external voltage Vcc and an input/output port 45 of the internal circuit 46. A source port of the diode type transistor T1 is commonly connected to the resistor R5, a gate port of the transistor T1 is connected to the line 47 of the external voltage Vcc, and a drain port of the transistor T1 is connected to an input port of the internal circuit 46. The detection module 42 detects static electricity induced to the line 47 of the external voltage Vcc and applies the detected static electricity to the driver 43 as a detected voltage by performing voltage drop with respect to the detected static electricity. In other words, the detection module 42 delivers voltage of the common connection port of the diode type transistor T1 and the resistor R5 to the driver 43 as the detected voltage in response to static electricity.

Such an electrostatic protection device for a semiconductor device according to the present embodiment induces static electricity introduced to the input/output port 45 to the line 47 of the external voltage Vcc through the delivery module 41 and always detects the static electricity induced to the line 47 of the external voltage Vcc through the detection module 42. In addition, the detection module 42 applies a detected voltage to the driver 43 in response to static electricity, thereby operating the driver 43. Thus, the driver 43 operates in response to the static electricity, so that static electricity induced to the line 47 of the external voltage Vcc is delivered to the line 48 of the grounding voltage Vss through the discharge module 44 and discharged. In other words, when static electricity is introduced to the input/output port 45, the electrostatic protection device for a semiconductor device according to the present invention always responds to static electricity and operates during all intervals of the static electricity. Accordingly, the electrostatic protection device for a semiconductor device according to the present invention operates during all intervals including a rising interval of the static electricity introduced to the input/output port 45, thereby protecting the internal circuit 46 from static electricity.

The electrostatic protection device according to the present embodiment may be realized to have the same effects as that according to a prior embodiment.

As described above, according to the present invention, static electricity introduced to an input/output port is detected through a detection module, so that the static electricity can be discharged during all intervals for the introduction of the static electricity. Accordingly, it is possible to stably protect an internal circuit of a semiconductor device from static electricity introduced to an input/output port and to prevent any increase in the size of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An electrostatic protection device for protecting an internal circuit of a semiconductor device from static electricity introduced into an input/output port of the semiconductor device, the electrostatic protection device comprising:

a delivery unit that induces static electricity introduced to the input/output port to a first reference potential voltage line for the semiconductor device;

a detection unit detecting the static electricity induced from the input/output port to the voltage line and outputting a detected voltage obtained by a voltage drip with respect to the static electricity; and a PMOS transistor coupled in series to an NMOS transistor, wherein the PMOS has its source coupled to said output terminal, its gate coupled to the first reference potential voltage line and its drain is connected to the drain of the NMOS transistor to form commonly-connected drains, the gate of the NMOS transistor is coupled to the first reference potential line and the source of the NMOS transistor is coupled to a second reference potential line for the semiconductor device; and the commonly connected drains are coupled to and control a third MOS transistor coupled across the first and second reference potential lines and which shunts static electricity to the second reference potential line.

2. The electrostatic protection device as claimed in claim 1, wherein the the first reference potential voltage line is Vcc for the semiconductor device.

3. The electrostatic protection device as claimed in claim 2, wherein the detection unit is configured to cause only positive-going static electricity to be introduced to the first reference potential voltage line.

4. The electrostatic protection device as claimed in claim 1, wherein the detection unit includes a resistor and a diode serially connected to the voltage line and the input/output port.

5. The electrostatic protection device as claimed in claim 4, wherein a cathode of the diode is connected to the resistor, and an anode of the diode is connected to the input/output port.

6. The electrostatic protection device as claimed in claim 4, wherein an output port of the detection unit is connected to a common connection port of the resistor and the diode.

7. The electrostatic protection device as claimed in claim 1, wherein the detection unit includes a diode type transistor and a resistor serially connected to the voltage line and the input/output port.

8. The electrostatic protection device as claimed in claim 7, wherein an output port of the detection unit is connected to a common connection port of the diode type transistor and the resistor.

* * * * *